United States Patent
Toda et al.

(10) Patent No.: US 9,691,631 B2
(45) Date of Patent: *Jun. 27, 2017

(54) ETCHING METHOD AND STORAGE MEDIUM

(71) Applicant: TOKYO ELECTRON LIMITED, Tokyo (JP)

(72) Inventors: Satoshi Toda, Nirasaki (JP); Kenshirou Asahi, Nirasaki (JP); Hiroyuki Takahashi, Nirasaki (JP); Kimihiko Demichi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/851,091

(22) Filed: Sep. 11, 2015

(65) Prior Publication Data

US 2016/0079081 A1    Mar. 17, 2016

(30) Foreign Application Priority Data

Sep. 16, 2014 (JP) ................. 2014-187436

(51) Int. Cl.
*H01L 21/311* (2006.01)
*H01L 21/3213* (2006.01)
*H01L 21/306* (2006.01)

(52) U.S. Cl.
CPC .. *H01L 21/31116* (2013.01); *H01L 21/30604* (2013.01); *H01L 21/30621* (2013.01); *H01L 21/311* (2013.01); *H01L 21/32135* (2013.01)

(58) Field of Classification Search
None
See application file for complete search history.

(56) References Cited

U.S. PATENT DOCUMENTS

| 6,541,401 B1* | 4/2003 | Herner ............... C23C 16/02 257/E21.243 |
| 8,070,972 B2 | 12/2011 | Tsujimoto |
| 8,778,210 B2 | 7/2014 | Cooper et al. |
| 2005/0074948 A1 | 4/2005 | Ko et al. |
| 2006/0207968 A1 | 9/2006 | Mambauer et al. |
| 2013/0023094 A1* | 1/2013 | Yeh ............. H01L 21/823807 438/218 |
| 2014/0357085 A1 | 12/2014 | Moriya et al. |

FOREIGN PATENT DOCUMENTS

| JP | 2005-39185 A | 2/2005 |
| JP | 2008-160000 A | 7/2008 |
| KR | 10-2004-0055350 A | 6/2004 |

* cited by examiner

*Primary Examiner* — Jiong-Ping Lu
(74) *Attorney, Agent, or Firm* — Nath, Goldberg & Meyer; Jerald L. Meyer

(57) ABSTRACT

There is provided an etching method, including: disposing a target substrate within a chamber, the target substrate having a first silicon oxide film formed on a surface of the target substrate and a second silicon oxide film formed adjacent to the first silicon oxide film, the first silicon oxide film being formed by an atomic layer deposition method and the second silicon oxide film being formed by a method other than the atomic layer deposition method; and selectively etching the first silicon oxide film with respect to the second silicon oxide film by supplying one selected from the group consisting of HF gas and alcohol gas; HF gas and water vapor; HF gas, $F_2$ gas, and alcohol gas; HF gas, $F_2$ gas, and water vapor, into the chamber.

9 Claims, 8 Drawing Sheets

ETCHING METHOD AND STORAGE MEDIUM

CROSS-REFERENCE TO RELATED APPLICATION

This application claims the benefit of Japanese Patent Application No. 2014-187436, filed on Sep. 16, 2014, in the Japan Patent Office, the disclosure of which is incorporated herein in its entirety by reference.

TECHNICAL FIELD

The present disclosure relates to a method of etching a silicon oxide film formed on a substrate and a storage medium therefor.

BACKGROUND

In recent years, in a manufacturing process of a semiconductor device, a method called chemical oxide removal (COR) which chemically performs etching within a chamber without generating plasma draws attention as a miniaturization etching technique substituted for plasma etching.

As the COR, there is known a process in which a silicon oxide film ($SiO_2$ film) existing on a surface of a semiconductor wafer as a target object is etched within a chamber held in a vacuum by causing a hydrogen fluoride (HF) gas and an ammonia ($NH_3$) gas to be adsorbed onto and react with the silicon oxide film to generate ammonium fluorosilicate (($NH_4)_2SiF_6$; AFS), and sublimating the ammonium fluorosilicate by heating the same in a subsequent step.

In recent years, a film (an ALD-$SiO_2$ film) formed by an atomic layer deposition method (an ALD method) is often used as a $SiO_2$ film which is formed in a manufacturing process of a semiconductor device. Another $SiO_2$ film (a thermal oxide film, etc.) formed by methods other than the ALD method, is sometimes formed adjacent to the ALD-$SiO_2$ film. As such, it is required to etch the ALD-$SiO_2$ film with high selectivity with respect to the thermal oxide film or the like. However, the use of the HF gas and the $NH_3$ gas makes it difficult to etch the ALD-$SiO_2$ film with a sufficiently high selectivity with respect to another $SiO_2$ film such as the thermal oxide film or the like.

SUMMARY

Some embodiments of the present disclosure provide a method capable of etching a silicon oxide film formed by an atomic layer deposition method, with high selectivity with respect to another silicon oxide film such as a thermal oxide film or the like, which is formed by other methods, without generating plasma within a chamber, and a non-transitory computer-readable storage medium therefor.

According to one embodiment of the present disclosure, there is provided an etching method, including: disposing a target substrate within a chamber, the target substrate having a first silicon oxide film formed on a surface of the target substrate and a second silicon oxide film formed adjacent to the first silicon oxide film, the first silicon oxide film being formed by an atomic layer deposition method and the second silicon oxide film being formed by a method other than the atomic layer deposition method; and selectively etching the first silicon oxide film with respect to the second silicon oxide film by supplying one selected from the group consisting of HF gas and alcohol gas; HF gas and water vapor; HF gas, $F_2$ gas, and alcohol gas; HF gas, $F_2$ gas, and water vapor, into the chamber.

According to another embodiment of the present disclosure, there is provided a non-transitory storage medium storing a program that operates on a computer and controls an etching apparatus, wherein the program, when executed, causes the computer to control the etching apparatus so as to perform the aforementioned etching method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<One Example of a Processing System Used in Embodiments of the Present Disclosure>

Figure 1:
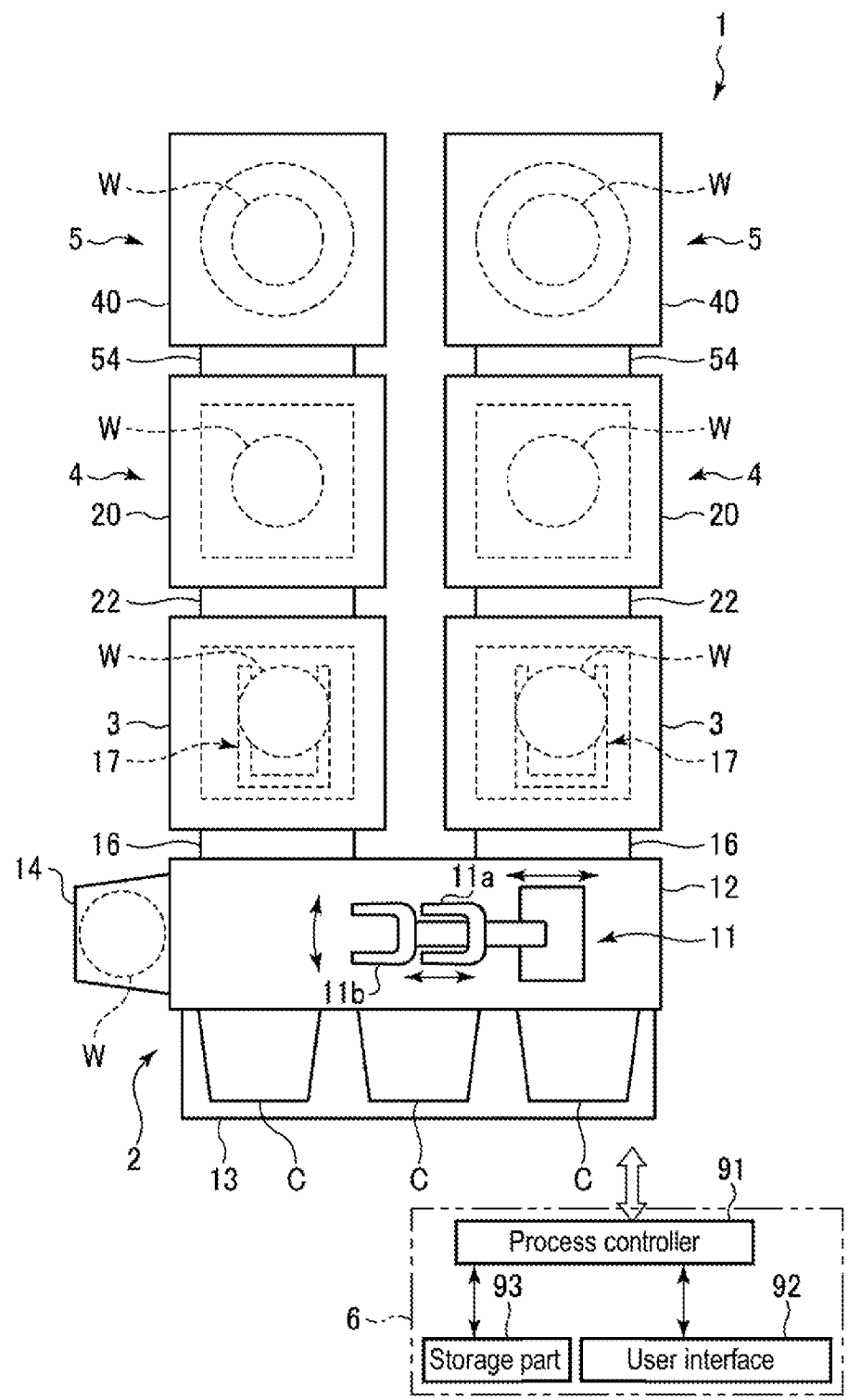
FIG. 1 is a schematic configuration view showing one example of a processing system including an etching apparatus that performs an etching method according to an embodiment of the present disclosure.

FIG. 1 is a schematic configuration view showing one example of a processing system equipped with an etching apparatus according to one embodiment of the present disclosure. The processing system 1 includes a loading/unloading section 2, two load lock chambers (L/L) 3, two heat treatment apparatuses 4, two etching apparatuses 5 and a controller 6. The loading/unloading section 2 is configured to load and unload a semiconductor wafer (hereinafter simply referred to as a "wafer") W therethrough. The two load lock chambers (L/L) 3 are disposed adjacent to the loading/unloading section 2. The two heat treatment apparatuses 4 are disposed adjacent to the respective load lock chambers 3 and configured to perform a heat treatment with respect to the wafer W. The two etching apparatuses 5 according to this embodiment, which are disposed adjacent to the respective heat treatment apparatuses 4, are configured to perform etching with respect to the wafer W without generating plasma within a chamber.

The loading/unloading section 2 includes a transfer chamber (L/M) 12 within which a first wafer transfer mechanism 11 for transferring the wafer W is installed. The first wafer transfer mechanism 11 includes two transfer arms 11a and 11b configured to hold the wafer W in a substantially horizontal posture. A mounting stage 13 is installed at one longitudinal side of the transfer chamber 12. The mounting stage 13 is configured to mount a plurality of (e.g., three) carriers C which are capable of accommodating a plurality of wafers W, respectively. In addition, an orienter 14 configured to perform position alignment of the wafer W by rotating the wafer W and finding an eccentric amount thereof is installed adjacent to the transfer chamber 12.

In the loading/unloading section 2, the wafer W is held by one of the transfer arms 11a and 11b and is moved linearly within a substantially horizontal plane or moved up and down by the operation of the first wafer transfer mechanism 11, thereby being transferred to a desired position. Further, the wafer W is loaded into or unloaded from the carriers C mounted on the mounting stage 13, the orienter 14 and the load lock chambers 3, as the transfer arms 11a and 11b move toward or away from the carriers C, the orienter 14 and the load lock chambers 3.

Each of the load lock chambers 3 is coupled to the transfer chamber 12 with a gate valve 16 interposed between each of the load lock chambers 3 and the transfer chamber 12. A second wafer transfer mechanism 17 for transferring the wafer W is installed within each of the load lock chambers 3. Each of the load lock chambers 3 is configured such that it can be evacuated to a predetermined vacuum degree.

The second wafer transfer mechanism 17 having an articulated arm structure includes a pick configured to hold the wafer W in a substantially horizontal posture. In the second wafer transfer mechanism 17, the pick can be positioned within each of the load lock chambers 3 when an articulated arm is retracted. The pick can reach a respective heat treatment apparatus 4 as the articulated arm is extended and can reach a respective etching apparatus 5 as the articulated arm is further extended. Thus, the second wafer transfer mechanism 17 can transfer the wafer W between the load lock chamber 3, the heat treatment apparatus 4 and the etching apparatus 5.

Figure 2:
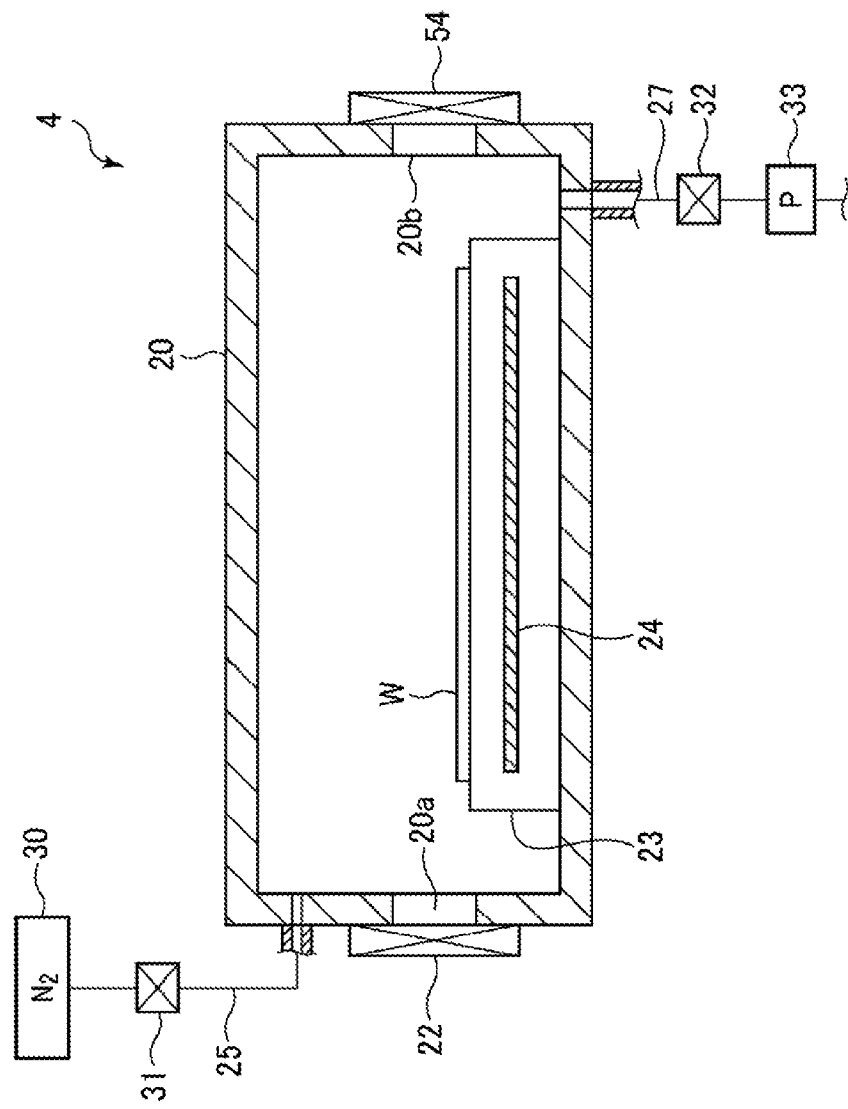
FIG. 2 is a sectional view showing a heat treatment apparatus equipped in the processing system shown in FIG. 1.

As shown in FIG. 2, each of the heat treatment apparatuses 4 includes a vacuum-evacuable chamber 20, and a mounting table 23 disposed within the chamber 20 and configured to mount the wafer W thereon. A heater 24 is embedded in the mounting table 23. After being subjected to an etching process, the wafer W is heated by the heater 24, thereby vaporizing and removing etching residue which exists on the wafer W. A loading/unloading gate 20a through which the wafer W is transferred between each of the heat treatment apparatuses 4 and the respective load lock chamber 3 is formed in a sidewall of the chamber 20 adjoining the load lock chamber 3. The loading/unloading gate 20a is opened and closed by a gate valve 22. In addition, a loading/unloading gate 20b through which the wafer W is transferred between the heat treatment apparatus 4 and the respective etching apparatus 5 is formed in the sidewall of the chamber 20 adjoining the etching apparatus 5. The loading/unloading gate 20b is opened and closed by a gate valve 54. A gas supply path 25 is connected to an upper portion of the sidewall of the chamber 20. The gas supply path 25 is coupled to an $N_2$ gas supply source 30. An exhaust path 27 is connected to a bottom wall of the chamber 20. The exhaust path 27 is coupled to a vacuum pump 33. A flow rate adjusting valve 31 is installed in the gas supply path 25. A pressure adjusting valve 32 is installed in the exhaust path 27. By controlling the flow rate adjusting valve 31 and the pressure adjusting valve 32, the interior of the chamber 20 is kept in a $N_2$ gas atmosphere having a predetermined pressure. In this state, a heat treatment is performed. Instead of the $N_2$ gas, another inert gas such as an Ar gas or the like may be used.

The controller 6 includes a process controller 91 provided with a microprocessor (computer) which controls the respective constituent parts of the processing system 1. A user interface 92, which includes a keyboard that allows an operator to perform a command input operation or the like in order to manage the processing system 1 and a display that visualizes and displays an operation status of the processing system 1, is connected to the process controller 91. Also connected to the process controller 91 is a storage part 93 which stores: control programs for realizing, under the control of the process controller, various types of processes performed in the processing system 1, for example, supply of a process gas and evacuation of the interior of the chamber in each of the etching apparatuses 5 (which will be described later); process recipes which are control programs for allowing the respective constituent parts of the processing system 1 to perform specified processes according to process conditions; and various types of databases. The process recipes are stored in a suitable storage medium (not shown) of the storage part 93. If necessary, an arbitrary recipe is called out from the storage part 93 and is executed by the process controller 91. In this way, desired processes are performed in the processing system 1 under the control of the process controller 91.

The etching apparatus 5 according to this embodiment is configured to etch an ALD-$SiO_2$ film into a specified pattern using HF gas, an alcohol gas, or the like. A detailed configuration of the etching apparatus 5 will be described later.

In the processing system 1 configured as above, a wafer which has the ALD-$SiO_2$ film as an etching target formed on the surface thereof, and a $SiO_2$ film, e.g., a thermal oxide film or a TEOS film, formed adjacent to the ALD-$SiO_2$ film by another method, is used as the wafer W. A plurality of wafers W of this type is accommodated within the carriers C and is transferred to the processing system 1. In the processing system 1, one of the wafers W is transferred from the carrier C mounted in the loading/unloading section 2 to one of the load lock chambers 3 by one of the transfer arms 11a and 11b of the first wafer transfer mechanism 11 while keeping the atmosphere-side gate valve 16 open. Subsequently, the wafer W is delivered to the pick of the second wafer transfer mechanism 17 disposed within the load lock chamber 3.

Thereafter, the atmosphere-side gate valve 16 is closed and the interior of the load lock chamber 3 is evacuated. Subsequently, the gate valve 54 is opened and the pick is extended into the respective etching apparatus 5, so that the wafer W is transferred to the etching apparatus 5.

Thereafter, the pick is returned to the load lock chamber 3 and the gate valve 54 is closed. Then, the etching process is performed within the etching apparatus 5 in the below-described manner.

After the etching process is completed, the gate valves 22 and 54 are opened. The etched wafer W is transferred to the heat treatment apparatus 4 by the pick of the second wafer transfer mechanism 17. While introducing the $N_2$ gas into the chamber 20, the wafer W mounted on the mounting table 23 is heated by the heater 24, thereby thermally removing etching residue or the like.

After the heat treatment is completed, the gate valve 22 is opened. The etched wafer W mounted on the mounting table 23 is moved to the load lock chamber 3 by the pick of the second wafer transfer mechanism 17. Then, the etched wafer W is returned to the carrier C by one of the transfer arms 11a and 11b of the first wafer transfer mechanism 11. Thus, a process for one wafer is completed.

In this embodiment, since a reaction product to be removed by the COR in the related art is not generated in the etching apparatuses 5, the heat treatment apparatuses 4 are not essential. In cases where no heat treatment apparatus is used, the wafer W after the etching process may be moved to one of the load lock chambers 3 by the pick of the second wafer transfer mechanism 17 and then returned to one of the carriers C by one of the transfer arms 11a and 11b of the first wafer transfer mechanism 11.

<Configuration of Etching Apparatus>

Next, the etching apparatus 5 according to this embodiment will be described in detail.

Figure 3:
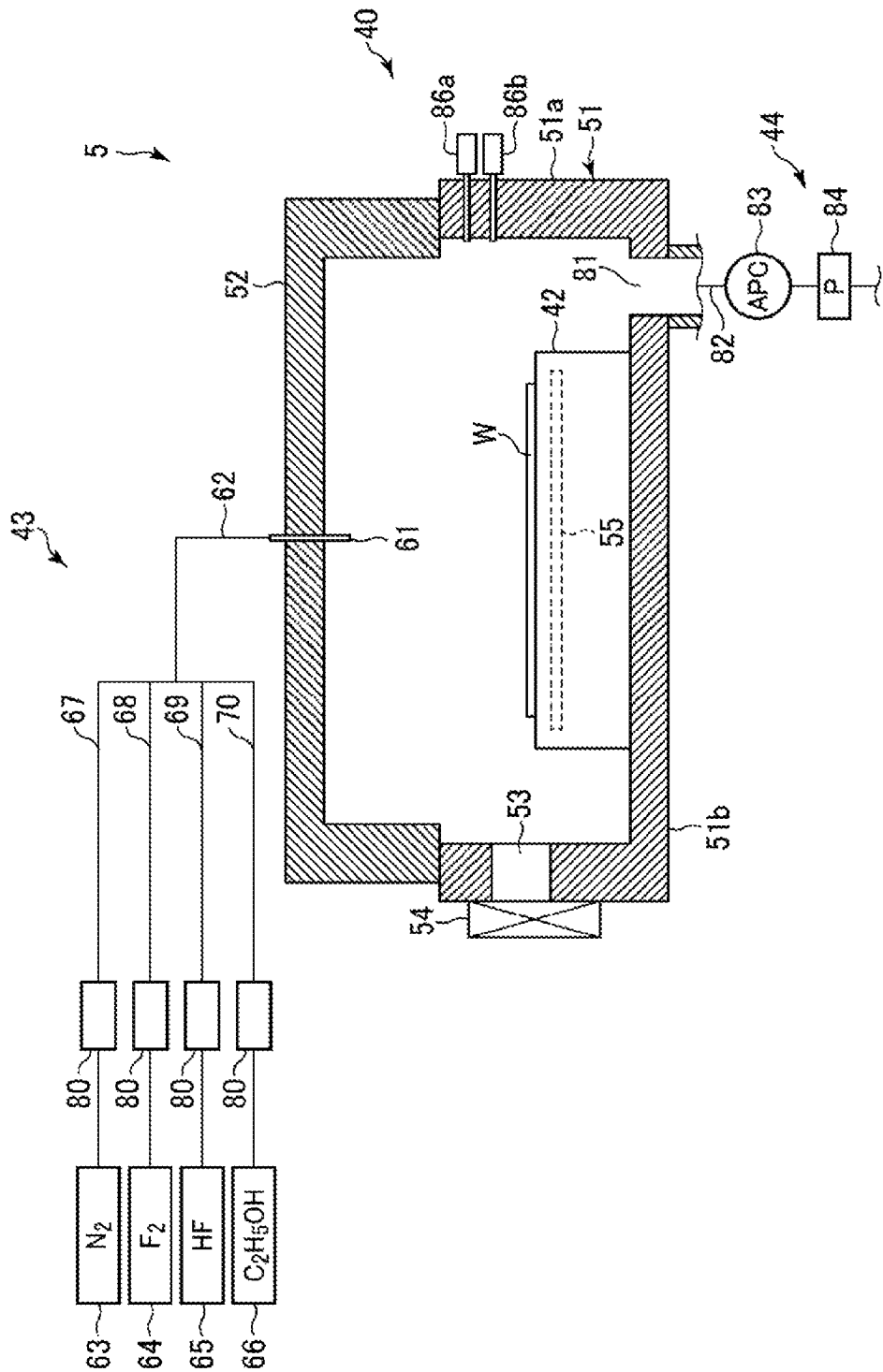
FIG. 3 is a sectional view showing an etching apparatus equipped in the processing system shown in FIG. 1.

FIG. 3 is a sectional view showing the etching apparatus 5 according to this embodiment. As shown in FIG. 3, the etching apparatus 5 includes a chamber 40 having a sealed structure. A mounting table 42 on which the wafer W is mounted in a substantially horizontal posture is installed within the chamber 40. The etching apparatus 5 further includes a gas supply mechanism 43 configured to supply an etching gas to the chamber 40, and an evacuation mechanism 44 configured to evacuate the interior of the chamber 40.

The chamber 40 is configured by a chamber body 51 and a cover part 52. The chamber body 51 includes a substantially cylindrical sidewall portion 51a and a bottom portion 51b. An upper portion of the chamber body 51 is opened. This opening is closed by the cover part 52. The sidewall portion 51a and the cover part 52 are sealed by a seal member (not shown), thereby securing the air-tightness of the interior of the chamber 40. A gas introduction nozzle 61 is inserted through a ceiling wall of the cover part 52 so as to extend from above toward the interior of the chamber 40.

A loading/unloading gate 53 through which the wafer W is transferred between the chamber 40 of the etching apparatus 5 and the chamber 20 of the heat treatment apparatus 4 is formed in the sidewall portion 51a. The loading/unloading gate 53 is opened and closed by a gate valve 54.

The mounting table 42 has a substantially circular shape when viewed from the top, and is fixed to the bottom portion 51b of the chamber 40. A temperature controller 55 configured to control a temperature of the mounting table 42 is installed within the mounting table 42. The temperature controller 55 includes a pipe line through which a temperature control medium (e.g., water, etc.) circulates. By heat exchange between the mounting table 42 and the temperature control medium flowing through the pipe line, the temperature of the mounting table 42 is controlled and hence a temperature of the wafer W mounted on the mounting table 42 is controlled.

The gas supply mechanism 43 includes a $N_2$ gas supply source 63 which supplies an $N_2$ gas as an inert gas, a $F_2$ gas supply source 64 which supplies an $F_2$ gas, a HF gas supply source 65 which supplies an HF gas, and an ethanol gas supply source 66 which supplies an ethanol ($C_2H_5OH$) gas as an alcohol gas. The gas supply mechanism 43 further includes a first gas supply pipe 67 coupled to the $N_2$ gas supply source 63, a second gas supply pipe 68 coupled to the $F_2$ gas supply source 64, a third gas supply pipe 69 coupled to the HF gas supply source 65, a fourth gas supply pipe 70 coupled to the ethanol gas supply source 66, and a common gas supply pipe 62 to which the first to fourth gas supply pipes 67 to 70 are connected. The common gas supply pipe 62 is connected to the gas introduction nozzle 61 mentioned above.

Flow rate controllers 80 configured to perform a flow path opening/closing operation and a flow rate control operation are installed in the first to fourth gas supply pipes 67 to 70, respectively. Each of the flow rate controllers 80 is configured by, e.g., an opening/closing valve and a mass flow controller.

Since the $F_2$ gas is a gas having an extremely high activity rate, a gas cylinder ordinarily used as the $F_2$ gas supply source 64 contains an $F_2$ gas diluted with an inert gas (typically, an $N_2$ gas or an Ar gas) at a volume ratio of the $F_2$ gas to the inert gas equal to 1:4. The $F_2$ gas may be diluted with inert gases other than the $N_2$ gas or the Ar gas.

In the gas supply mechanism 43 configured as above, the $N_2$ gas, the $F_2$ gas, the HF gas and the ethanol gas are supplied from the $N_2$ gas supply source 63, the $F_2$ gas supply source 64, the HF gas supply source 65 and the ethanol gas supply source 66 to the common gas supply pipe 62 through the first to fourth gas supply pipes 67 to 70, respectively, and then are supplied into the chamber 40 via the gas introduction nozzle 61. A shower plate (not shown) may be installed in the upper portion of the chamber 40 to supply the aforementioned gases in a shower-like manner through the shower plate.

In this embodiment, although the ethanol gas is used as an example of the alcohol gas, alcohol is not limited to ethanol but may be other types of alcohol. In that case, a gas supply source configured to supply the relevant alcohol gas may be used in place of the ethanol gas supply source 66. In some embodiments, a monovalent alcohol may be used as the alcohol. In addition to ethanol, at least one selected from a group consisting of methanol ($CH_3OH$), propanol ($C_3H_7OH$), and butanol ($C_4H_9OH$) may be suitably used as the monovalent alcohol. Propanol has two types of structural isomers and butanol has four types of structural isomers, whichever may be used as the monovalent alcohol. It is presumed that an OH group contained in alcohol contributes to etching. Instead of alcohol, water may be used as an OH group-containing material. In that case, water vapor may be supplied from a water vapor supply source instead of the ethanol gas supply source 66.

The $N_2$ gas as an inert gas is used as a dilution gas. Alternatively, an Ar gas alone or a combination of the $N_2$ gas and the Ar gas may be used as the inert gas. Although the $N_2$ gas and the Ar gas may be used as the inert gas, other inert gases, e.g., rare gases such as a He gas other than the Ar gas, may be used in some other embodiments. The inert gas may be used not only as the dilution gas but also as a purge gas that purges the interior of the chamber 40.

The evacuation mechanism 44 includes an exhaust pipe 82 connected to an exhaust port 81 formed in the bottom portion 51b of the chamber 40. The evacuation mechanism 44 further includes an automatic pressure control valve (APC) 83, which is installed in the exhaust pipe 82 and configured to control the internal pressure of the chamber 40, and a vacuum pump (P) 84 configured to evacuate the interior of the chamber 40.

In the sidewall of the chamber 40, two capacitance manometers 86a and 86b as pressure gauges for measuring the internal pressure of the chamber 40 are installed such that the capacitance manometers 86a and 86b are inserted into the chamber 40. The capacitance manometer 86a is used to measure a high pressure while the capacitance manometer 86b is used to measure a low pressure. A temperature sensor (not shown) for detecting the temperature of the wafer W is installed near the wafer W mounted on the mounting table 42.

Aluminum is used as the material of the respective constituent parts, such as the chamber 40 and the mounting table 42, which constitute the etching apparatus 5. The aluminum material which constitutes the chamber 40 may be a pure aluminum material or an aluminum material having an anodized inner surface (the inner surface of the chamber body 51, etc.). On the other hand, a surface of the aluminum material which constitutes the mounting table 42 requires wear resistance. Therefore, an oxide film ($Al_2O_3$ film) having high wear resistance may be in some embodiments formed on the surface of the aluminum material by anodizing the aluminum material.

<Etching Method using Etching Apparatus>

Next, a description will be made on an etching method using the etching apparatus configured as above.

In this example, while keeping the gate valve 54 open, the wafer W is loaded into the chamber 40 through the loading/unloading gate 53 by the pick of the second wafer transfer mechanism 17 disposed within the load lock chamber 3. As described above, the wafer W includes an ALD-$SiO_2$ film as an etching target formed thereon, and a $SiO_2$ film (e.g., a thermal oxide film or a TEOS film) formed adjacent to the ALD-$SiO_2$ film by another method. Then, the wafer W is mounted on the mounting table 42. The ALD-$SiO_2$ film as the etching target may be, e.g., a film formed by using a $SiH_4$ gas or a silane-based gas such as aminosilane or the like, as a Si precursor. In addition, the TEOS film refers to a film formed by a chemical vapor deposition (CVD) method using tetraethoxysilane (TEOS) as the Si precursor. The TEOS film may be a PTEOS film formed by a plasma CVD method.

Thereafter, the pick is returned to the load lock chamber 3. The gate valve 54 is closed to keep the interior of the chamber 40 in a sealed state.

Subsequently, the $F_2$ gas, the HF gas and the ethanol gas (used as the alcohol gas) are diluted with the $N_2$ gas as the inert gas, and are introduced into the chamber 40, thereby selectively etching the ALD-$SiO_2$ film in the wafer W.

Specifically, the temperature of the mounting table 42 is controlled by the temperature controller 55 so as to fall within a predetermined range. The internal temperature of the chamber 40 is also regulated to fall within a predetermined range. In this state, the $N_2$ gas, the $F_2$ gas, the HF gas and the ethanol gas are introduced from the $N_2$ gas supply source 63, the $F_2$ gas supply source 64, the HF gas supply source 65 and the ethanol gas supply source 66 of the gas supply mechanism 43 into the chamber 40 through a series of the first to fourth gas supply pipes 67 to 70, the common gas supply pipe 62 and the gas introduction nozzle 61, thereby etching the ALD-$SiO_2$ film.

At this time, the $F_2$ gas is not essential, and the HF gas alone may be supplied instead of a combination of the HF gas and the $F_2$ gas. As described above, other alcohol gases may be used in place of the ethanol gas, monovalent alcohol may be used in some embodiments as the alcohol, and besides ethanol, methanol, propanol or butanol may be suitably used as the monovalent alcohol. In addition, water vapor may be used in place of the alcohol gas.

The ALD-$SiO_2$ film differs in etching characteristic from the thermal oxide film or the TEOS film. That is to say, in the case where, as in this embodiment, gas obtained by suitably diluting the HF gas alone (or the combination of the HF gas and the $F_2$ gas) and the alcohol gas (or the water vapor) with the inert gas according to need is used as the etching gas, the ALD-$SiO_2$ film is easily subjected to etching by the alcohol gas or an OH group existing in the water vapor. In contrast, the thermal oxide film or the TEOS film is denser than the ALD-$SiO_2$ film. Thus, it is presumed that the OH group does not contribute much to the progress of etching of the thermal oxide film or the TEOS film. This makes it possible to etch the ALD-$SiO_2$ film with a high selectivity with respect to the thermal oxide film or the TEOS film. Selection of conditions makes it possible to increase an etching rate of the ALD-$SiO_2$ film, thus etching the ALD-$SiO_2$ film in one step without stopping the etching.

In some embodiments, the internal pressure of the chamber 40 in the etching process may fall within a range of from 66.7 to 40,000 Pa (from 0.5 to 300 Torr). Further, in some embodiments, the temperature of the mounting table 42 (substantially equal to the temperature of the wafer) may range from 0 to 300 degrees C. Under such conditions where ranges of pressure and temperature are wide, it is possible to etch the ALD-$SiO_2$ film with a high selectivity with respect to another $SiO_2$ film such as the thermal oxide film or the like. Suitable conditions may be selected depending on the etching characteristics required within these ranges.

As an example, in the case that another oxide film need not be substantially etched without increasing the etching rate of the ALD-$SiO_2$ film, low-pressure and low-temperature conditions may be applied. In some embodiments, the internal pressure of the chamber 40 may range from 66.7 to 1,333 Pa (from 0.5 to 10 Torr) and the temperature of the mounting table 42 may range from 0 to 30 degrees C. In other embodiments, the internal pressure of the chamber 40 may range from 133 to 667 Pa (from 1 to 5 Torr), and the temperature of the mounting table 42 may range from 0 to 15 degrees C. In still other embodiments, the internal pressure of the chamber 40 may range from 267 to 533 Pa (from 2 to 4 Torr), and the temperature of the mounting table 42 may range from 0 to 10 degrees C.

On the other hand, in view of increasing the etching rate of the ALD-$SiO_2$ film to prevent the etching from stopping while accepting a slightly etching of another oxide film, high-pressure and high-temperature conditions may be applied. As an example, the internal pressure of the chamber 40 may range from 1,333 to 40,000 Pa (10 to 300 Torr), and the temperature of the mounting table 42 (substantially equal to the temperature of the wafer) may range from 100 to 300 degrees C. In some embodiments, the internal pressure of the chamber 40 may range from 4,000 to 13,333 Pa (30 to 100 Torr), and the temperature of the mounting table 42 may range from 150 to 250 degrees C.

A volume ratio (flow rate ratio) of the $F_2$ gas to the total sum of the $F_2$ gas+the HF gas may fall within a range of from 0 to 85%, and in some embodiments, may fall within a range of from 0 to 67%. The alcohol gas tends to increase the etching selectivity of the ALD-$SiO_2$ film with respect to the thermal oxide film or the like. Thus, in some embodiments, a volume ratio (flow rate ratio) of the alcohol gas (or the water vapor) to the total sum of the $F_2$ gas+the HF gas+the alcohol gas (or the water vapor) may fall within a range of from 3 to 85%. Under the low-pressure and low-temperature conditions where another oxide film such as the thermal oxide film or the like is not etched as far as possible, the volume ratio may fall within a range of from 3 to 50%, and in some embodiments, may fall within a range of from 5 to 15%. Under the high-pressure and high-temperature conditions where the etching rate of the ALD-$SiO_2$ film remains high, the volume ratio may fall within a range of from 10 to 85%, and in some embodiments, may fall within a range of from 17 to 67%. The inert gas such as the $N_2$ gas or the like is unavoidably contained in the $F_2$ gas supply source 64. In some embodiments, a certain amount of the inert gas may be contained in the $F_2$ gas supply source 64 even when the $F_2$ gas is not used. In this case, a volume ratio (flow rate ratio) of the inert gas to the total sum of the HF gas alone (or the combination of the HF gas and the $F_2$ gas)+the alcohol gas (or the water vapor)+the inert gas may fall within a range of 80% or less, and in some embodiments, may fall within a range of from 55 to 75%.

As described above, by using the HF gas alone (or the combination of the HF gas and the $F_2$ gas), the alcohol gas or the like and by optimizing conditions such as a gas composition, a pressure, a temperature and the like, it is possible to etch the ALD-$SiO_2$ film with an extremely high selectivity of about 50 or more (or 100 or more) with respect to the thermal oxide film or the TEOS film. In addition, the etching rate of the ALD-$SiO_2$ film can have a high value of 10 nm/min or more.

After the etching process in the etching apparatus 5 is completed in this way, the gate valve 54 is opened. The etched wafer W mounted on the mounting table 42 is unloaded from the chamber 40 by the pick of the second wafer transfer mechanism 17. Consequently, the etching process performed by the etching apparatus 5 is terminated.

Experimental Examples

Next, descriptions will be made on experimental examples.

Experimental Example 1

In Experimental example 1, etching properties were compared in the case where the conventional HF/$NH_3$-based gas is used as a process gas and in the case where a HF/ethanol-based gas of the present disclosure is used as the process gas.

A $SiO_2$ film (ALD-$SiO_2$ film) formed by an ALD method and a thermal oxide film (Th—$SiO_2$ film) were etched under conditions where a temperature of a mounting table rages from 100 to 150 degrees C. and an internal pressure of a chamber ranges from 2 to 4 Torr, using the conventional process gas having the following condition:

Volume ratio of $NH_3$ gas to the total sum of HF gas and $NH_3$ gas: 56.6%,

Flow rate of $N_2$ gas+Ar gas: 500 to 1,000 sccm, and
Total gas flow rate: 1,000 to 2,000 sccm.

On the other hand, the ALD-$SiO_2$ film and the Th—$SiO_2$ film were etched under conditions where a temperature of a mounting table ranges from 0 to 10 degrees C. and an internal pressure of a chamber ranges from 2 to 4 Torr, using the process gas of the present disclosure having the following condition:

Volume ratio of ethanol gas to the total sum of HF gas and ethanol gas (Et—OH): 10.7%,
Flow rate of $N_2$ gas+Ar gas: 500 to 1,500 sccm, and
Total gas flow rate: 1,000 to 2,000 sccm.

Figure 4:
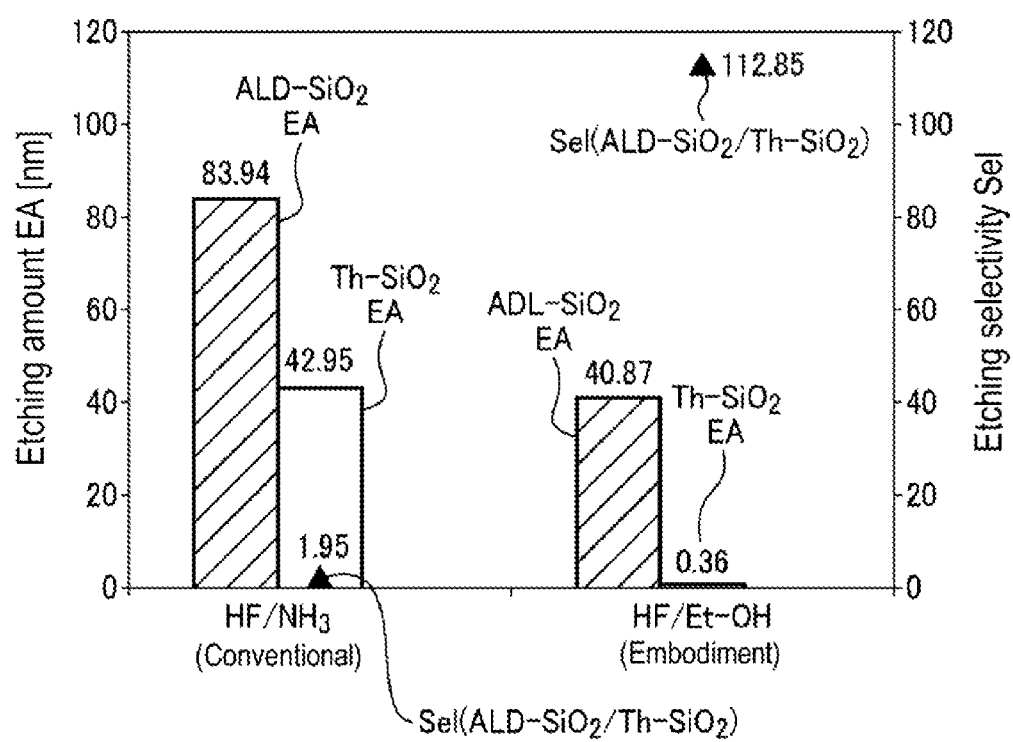
FIG. 4 is a view showing a relationship between an etching amount and an etching selectivity in Experimental example 1 when ALD-$SiO_2$ and Th—$SiO_2$ films are etched by a conventional gas system and a gas system of the present disclosure.

A relationship between an etching amount (EA) and an etching selectivity (Sel) available at the etching is shown in FIG. 4. As shown in FIG. 4, when the conventional HF/$NH_3$-based gas is used, the ALD-$SiO_2$ film was etched at a high etching amount and the etching amount of the Th—$SiO_2$ film was also high. Thus, the etching selectivity of the ALD-$SiO_2$ film to the Th—$SiO_2$ film (ALD-$SiO_2$/Th—$SiO_2$) was at a low level of 1.95. In contrast, when the HF/Et—OH-based gas of the present disclosure is used, the etching amount of the ALD-$SiO_2$ film was somewhat at a level lower than when the HF/$NH_3$-based gas is used. However, the etching amount of the Th—$SiO_2$ film was very small so that the etching selectivity of (ALD-$SiO_2$/Th—$SiO_2$) was at a high level of 112.85, which exceeds 100.

Experimental Example 2

Experimental example 2 was performed to check an etching effectiveness of the ethanol gas. Etching properties of an ALD-$SiO_2$ film and a Th—$SiO_2$ film were compared in the case where a HF gas alone is used as an etching gas and is supplied at a flow rate ranging from 500 to 1,000 sccm and in the case where the ethanol gas is added at a volume ratio of 4.6% with respect to the total sum of the ethanol gas and the HF gas. In addition, the comparison was performed under low-pressure and low-temperature conditions as follows:

Temperature of mounting table: 0 to 10 degrees C., and
Internal pressure of chamber: 0.5 to 1.0 Torr.

Figure 5A:
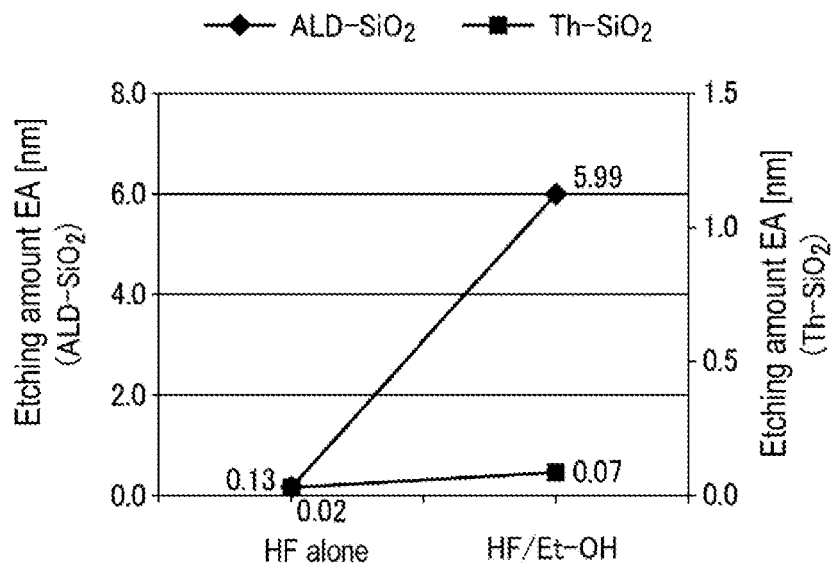
FIGS. 5A and 5B are views showing a comparison between etching properties of ALD-$SiO_2$ and Th—$SiO_2$ films in Experimental example 2 when a HF gas alone is used as an etching gas and when a combination of an ethanol gas and the HF gas is used as the etching gas, FIG. 5A being a view showing an etching amount and FIG. 5B being a view showing an etching selectivity of ALD-$SiO_2$/Th—$SiO_2$.
Figure 5B:
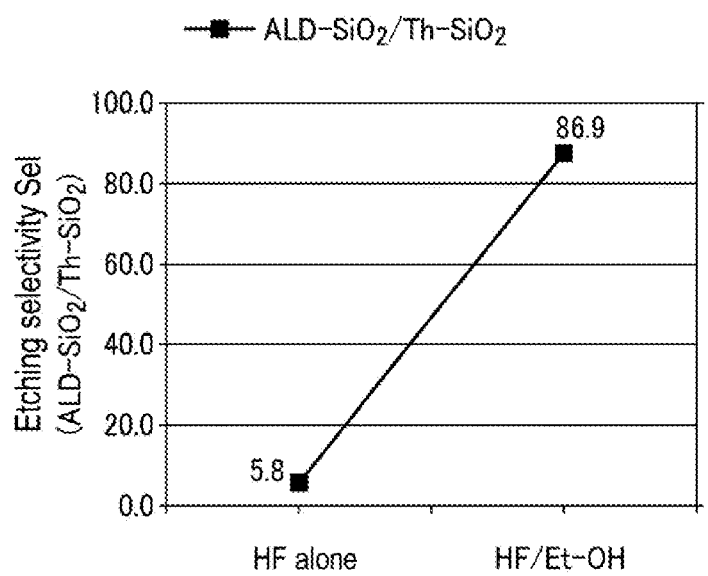

An etching amount and an etching selectivity available at this time are shown in FIGS. 5A and 5B, respectively. As shown in FIGS. 5A and 5B, Experiment example 2 shows that the etching amount of the Th—$SiO_2$ film is not substantially changed in the case where the HF gas alone is used and in the case where the ethanol gas is added to the HF gas, while the etching amount of the ALD-$SiO_2$ film is sharply increased by the addition of the ethanol gas. Thus, this example shows that the etching selectivity of the ALD-$SiO_2$ film to the Th—$SiO_2$ film is drastically increased by the addition of the ethanol gas to the HF gas.

Experimental Example 3

Experimental example 3 was performed to check a dependency of a flow rate of an ethanol gas on etching. In Experimental example 3, etching properties of an ALD-$SiO_2$ film and a Th—$SiO_2$ film were determined by changing a flow rate ratio (%) of an ethanol gas (i.e., a ratio of a flow rate of the ethanol gas to the total flow rate of the HF gas+the ethanol gas) within a range from 5 to 12%. In addition, this example was performed under the following conditions:

Temperature of mounting table: 0 to 10 degrees C., and
Internal pressure of chamber: 2.0 to 3.0 Torr.

Figure 6A:
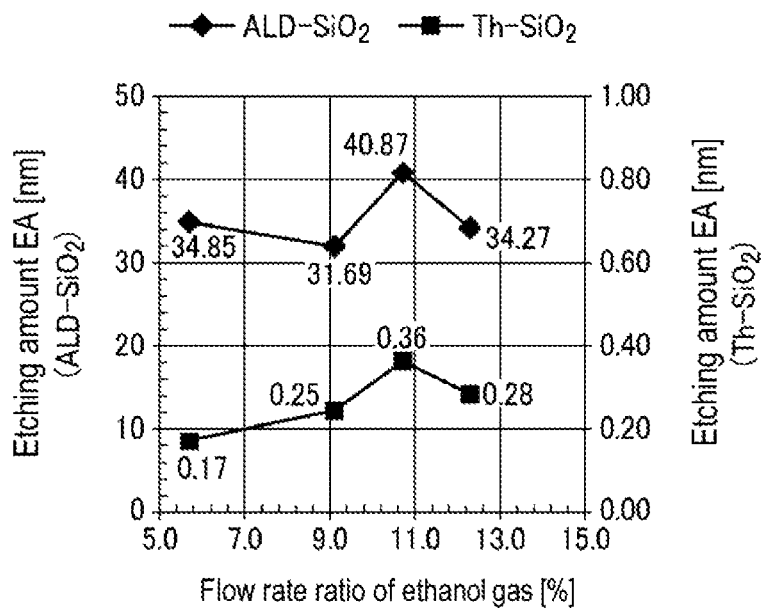
FIGS. 6A and 6B are views showing a dependency of an ethanol gas flow rate on etching properties of ALD-$SiO_2$ and Th—$SiO_2$ films in Experimental example 3, FIG. 6A being a view showing an etching amount and FIG. 6B being a view showing an etching selectivity of ALD-$SiO_2$/Th—$SiO_2$.
Figure 6B:
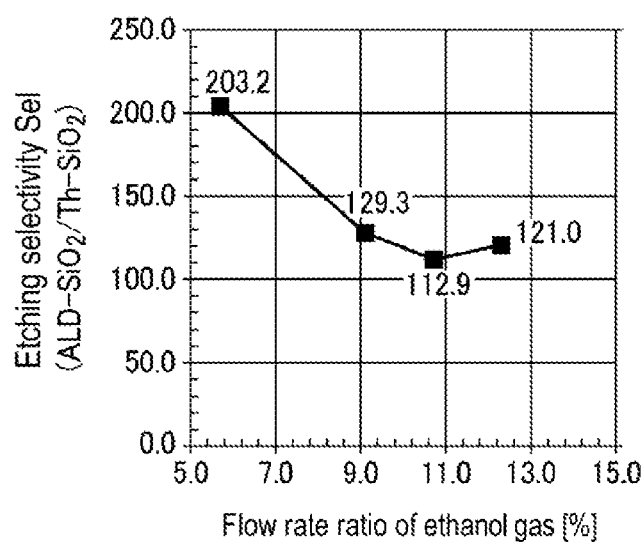

An etching amount and an etching selectivity available at this time are shown in FIGS. 6A and 6B, respectively. As shown in FIGS. 6A and 6B, this example shows that, under low-pressure and low-temperature conditions as described above, when the flow rate ratio of the ethanol gas ranges from 5 to 12%, the etching amount of the ALD-SiO$_2$ film tends to be large while the etching amount of the Th—SiO$_2$ film tends to be small. Thus, the etching selectivity of the ALD-SiO$_2$ film to the Th—SiO$_2$ film was significantly high. Specifically, this example shows that, when the flow rate ratio of the ethanol gas ranges from 5 to 12%, the etching selectivity of the ALD-SiO$_2$ film to the Th—SiO$_2$ film tends to decrease as the flow rate ratio of the ethanol gas increases, wherein the etching selectivity exceeds a value of 100.

Experimental Example 4

In Experimental example 4, a wafer obtained by attaching a chip with a Th—SiO$_2$ film formed thereon and a chip with an ALD-SiO$_2$ film formed thereon was prepared. Etching was performed on the wafer under the following conditions:
 Flow rate of HF gas: 1,000 sccm,
 Flow rate (equivalent value) of F$_2$ gas: 200 sccm (flow rate of Ar gas: 800 sccm),
 Flow rate of N$_2$ gas: 200 sccm,
 Flow rate of ethanol gas: 500 sccm,
 Temperature of mounting table: High temperature of 200 degrees C.,
 Internal pressure of chamber: High pressure of 30 Torr (4,000 Pa) and 50 Torr (6,665 Pa).
The ALD-SiO$_2$ film was formed using aminosilane as a Si precursor.

Figure 7A:
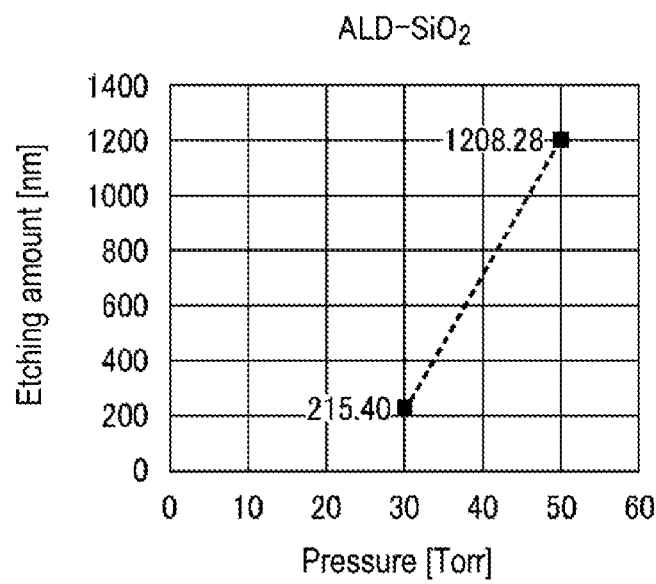
FIG. 7A is a view showing a relationship between an internal pressure of a chamber and an etching amount of an ALD-$SiO_2$ film in Experimental example 4.
Figure 7B:
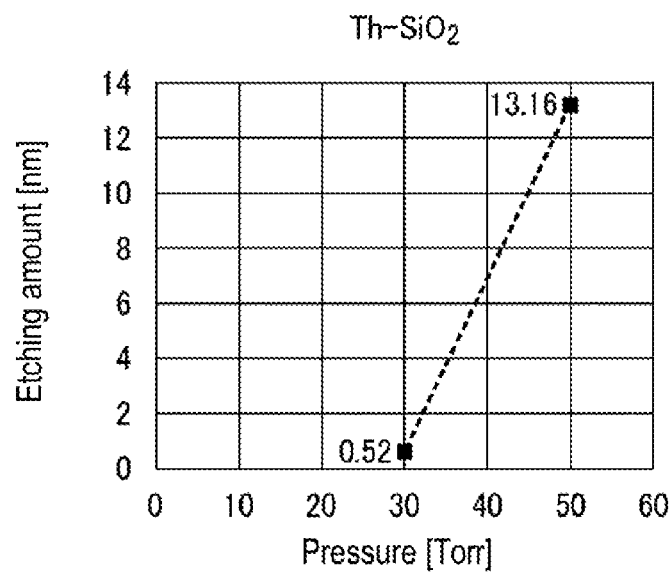
FIG. 7B is a view showing a relationship between the internal pressure of the chamber and an etching amount of a Th—$SiO_2$ film in Experimental example 4.

The results are shown in FIGS. 7A and 7B. FIG. 7A is a view showing a relationship between an internal pressure of the chamber and an etching amount of the ALD-SiO$_2$ film. FIG. 7B is a view showing a relationship between the internal pressure of the chamber and an etching amount of the Th—SiO$_2$ film. As shown in FIGS. 7A and 7B, at the pressure of 30 Torr (4,000 Pa), the etching amount of the ALD-SiO$_2$ film was 215.40 nm and the etching amount of the Th—SiO$_2$ film was 0.52 nm. An etching selectivity calculated from these etching amounts was 414.23. Meanwhile, at the pressure of 50 Torr (6,665 Pa), the etching amount of the ALD-SiO$_2$ film was 1208.28 nm and the etching amount of the Th—SiO$_2$ film was 13.16 nm. An etching selectivity calculated from these etching amounts was 91.81. As mentioned above, this example shows that, under the high-pressure and high-temperature conditions, the ALD-SiO$_2$ film can be etched with an extremely high etching rate and an extremely high etching selectivity with respect to the Th—SiO$_2$ film.

Experimental Example 5

In Experimental example 5, a blanket wafer with an ALD-SiO$_2$ film formed thereon and another blanket wafer with a PTEOS film (or PTEOS) formed thereon, which is a SiO$_2$ film formed by a CVD method (which refers to a CVD-SiO$_2$ film), were prepared. Etching was performed on these blanket wafers under the same conditions as those of Experimental example 1.

Figure 8A:
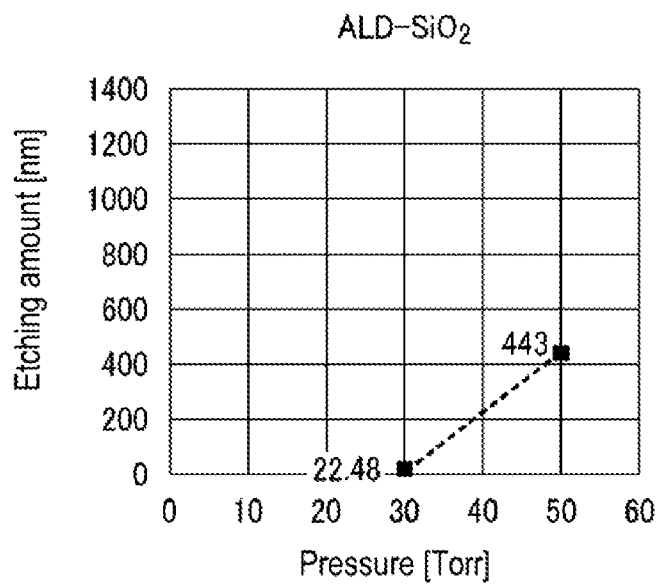
FIG. 8A is a view showing a relationship between an internal pressure of a chamber and an etching amount of an ALD-$SiO_2$ film in Experimental example 5.
Figure 8B:
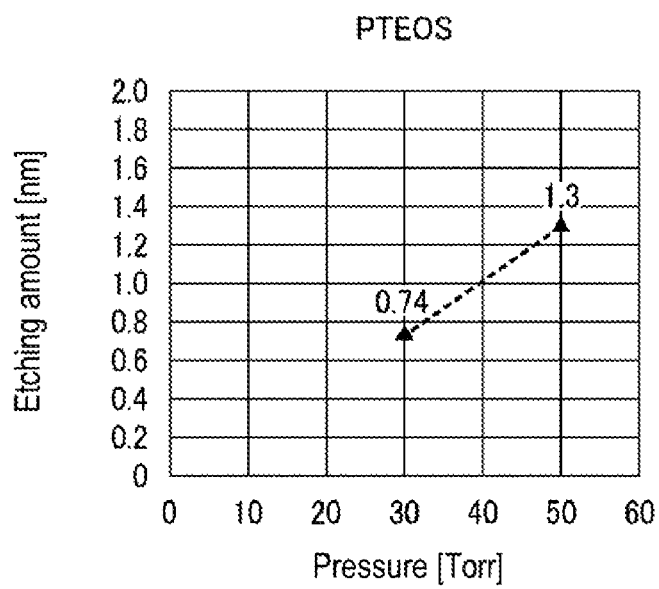
FIG. 8B is a view showing a relationship between the internal pressure of the chamber and an etching amount of a PTEOS film in Experimental example 5.

The results are shown in FIGS. 8A and 8B. FIG. 8A is a view showing a relationship between an internal pressure of a chamber and an etching amount of the ALD-SiO$_2$ film. FIG. 8B is a view showing a relationship between the internal pressure of the chamber and an etching amount of the PTEOS film. As shown in FIGS. 8A and 8B, at the pressure of 30 Torr (4,000 Pa), the etching amount of the ALD-SiO$_2$ film was 22.48 nm, while the etching amount of the PTEOS film was 0.74 nm. An etching selectivity calculated from these etching amounts was 39.38. Meanwhile, at the pressure of 50 Torr (6,665 Pa), the etching amount of the ALD-SiO$_2$ film was 443 nm, while the etching amount of the PTEOS film was 1.3 nm. An etching selectivity calculated from these etching amounts was 340.77. As mentioned above, this example shows that, under the high-pressure and high-temperature conditions, the ALD-SiO$_2$ film can be etched with an extremely high etching rate and an extremely high etching selectivity with respect to the PTEOS film.

<Other Applications of the Present Disclosure>

The present disclosure is not limited to the aforementioned embodiments and may be differently modified. As an example, the apparatuses of the aforementioned embodiments have been presented by way of example only. Indeed, the etching method according to the present disclosure may be implemented by various apparatuses having different configurations. Furthermore, while the semiconductor wafer has been described to be used as a target substrate, the present disclosure is not limited thereto. In some embodiments, the target substrate may be other substrates such as a flat panel display (FPD) substrate represented by a liquid crystal display (LCD) substrate, a ceramic substrate, and the like.

According to the present disclosure, by supplying a HF gas alone (or a combination of the HF gas and a F$_2$ gas), an alcohol gas (or water vapor), and an inert gas into a chamber, it is possible to etch a first silicon oxide film formed on a surface of a target substrate, with an extremely high selectivity with respect to a second silicon oxide film, without generating plasma within the chamber. The first silicon oxide film is formed by an atomic layer deposition method, and the second silicon oxide film is formed adjacent to the first silicon oxide film by a method other than the atomic layer deposition method.

While certain embodiments have been described, these embodiments have been presented by way of example only, and are not intended to limit the scope of the present disclosure. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method, comprising:
 disposing a target substrate within a chamber, the target substrate having a first silicon oxide film formed on a surface of the target substrate and a second silicon oxide film without having a passivation layer thereon formed adjacent to the first silicon oxide film, the first silicon oxide film being formed by an atomic layer deposition method and the second silicon oxide film being formed by a method other than the atomic layer deposition method; and
 selectively etching the first silicon oxide film with respect to the second silicon oxide film by supplying one selected from the group consisting of HF gas and alcohol gas; HF gas and water vapor; HF gas, F$_2$ gas, and alcohol gas; HF gas, F$_2$ gas, and water vapor, into the chamber.

2. The etching method of claim 1, further comprising: supplying an inert gas to perform the etching.

3. The etching method of claim 1, wherein the second silicon oxide film is a thermal oxide film or a TEOS film.

4. The etching method of claim 1, wherein the etching is performed under conditions where an internal pressure of the chamber ranges from 66.7 to 40,000 Pa, and a temperature of a mounting table disposed within the chamber and configured to mount the target substrate thereon ranges from 0 to 300 degrees C.

5. The etching method of claim 4, wherein the etching is performed under conditions where the internal pressure of the chamber ranges from 66.7 to 1,333 Pa and the temperature of the mounting table ranges from 0 to 30 degrees C.

6. The etching method of claim 4, wherein the etching is performed under conditions where the internal pressure of the chamber ranges from 1,333 to 40,000 Pa and the temperature of the mounting table ranges from 100 to 300 degrees C.

7. The etching method of claim 1, wherein the alcohol gas includes at least one selected from a group consisting of ethanol ($C_2H_5OH$), methanol ($CH_3OH$), propanol ($C_3H_7OH$) and butanol ($C_4H_9OH$).

8. The etching method of claim 1, wherein, in the etching, a volume ratio of the $F_2$ gas to a total sum of the $F_2$ gas and the HF gas is set to fall within a range of from 0 to 85%.

9. The etching method of claim 1, wherein, in the etching, a volume ratio of one of the alcohol gas and the water vapor to a total sum of the $F_2$ gas+the HF gas+one of the alcohol gas and the water vapor is set to fall within a range of from 3 to 85%.

* * * * *